(12) United States Patent
Ha et al.

(10) Patent No.: US 11,095,316 B2
(45) Date of Patent: Aug. 17, 2021

(54) CONTROLLER AND OPERATING METHOD FOR PERFORMING READ OPERATION TO READ DATA IN MEMORY DEVICE

(71) Applicants: SK hynix Inc., Icheon-si (KR); Korea Advanced Institute of Science and Technology, Daejeon (KR)

(72) Inventors: Jeong-Seok Ha, Daejeon (KR); Ji-Eun Oh, Daejeon (KR); Myung-In Kim, Hanam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/716,149

(22) Filed: Dec. 16, 2019

(65) Prior Publication Data
US 2020/0259511 A1    Aug. 13, 2020

(30) Foreign Application Priority Data
Feb. 13, 2019   (KR) .................. 10-2019-0016756

(51) Int. Cl.
*H03M 13/45* (2006.01)
*H03M 13/00* (2006.01)
*G06F 11/10* (2006.01)
*G06F 11/00* (2006.01)

(52) U.S. Cl.
CPC ....... *H03M 13/458* (2013.01); *G06F 11/1076* (2013.01); *H03M 13/616* (2013.01)

(58) Field of Classification Search
CPC combination set(s) only.
See application file for complete search history.

(56) References Cited

U.S. PATENT DOCUMENTS

| | | | | |
|---|---|---|---|---|
| 9,459,956 | B2* | 10/2016 | Hubris | H03M 13/116 |
| 10,491,243 | B2* | 11/2019 | Kumar | G06F 11/1012 |
| 2016/0087653 | A1* | 3/2016 | Yang | G11B 20/1833 |
| | | | | 714/752 |
| 2020/0218607 | A1* | 7/2020 | Ha | H03M 13/3715 |

FOREIGN PATENT DOCUMENTS

| KR | 10-1718543 | 3/2017 |
|---|---|---|
| KR | 10-2018-0010448 | 1/2018 |

\* cited by examiner

*Primary Examiner* — Justin R Knapp
(74) *Attorney, Agent, or Firm* — Perkins Coie LLP

(57) ABSTRACT

A controller is provided to include a processor reading data from a memory device, and a decoder receiving the data and decoding the data, the data being represented with check nodes and variable nodes. The decoder includes a check unit calculating syndrome values, a calculation unit receiving the decision values of the variable nodes and calculating flipping function values, a setting unit receiving the flipping function values and generating a candidate vector by dividing the flipping function values into groups and selecting at least some maximum values from the groups, the setting unit setting a flipping function threshold value, and a flipping unit receiving the flipping function threshold value, comparing the flipping function values of the variable nodes with the flipping function threshold value, and flipping a decision value of a target variable node having a greater flipping function value than the flipping function threshold value.

20 Claims, 13 Drawing Sheets

CONTROLLER AND OPERATING METHOD FOR PERFORMING READ OPERATION TO READ DATA IN MEMORY DEVICE

CROSS-REFERENCE TO RELATED APPLICATION

This patent document claims priority under 35 U.S.C. § 119 to Korean Patent Application No. 10-2019-0016756 filed on Feb. 13, 2019, which is incorporated herein by reference in its entirety.

TECHNICAL FIELD

The technology and implementations disclosed in this patent document relate to a controller and an operating method thereof.

BACKGROUND

A storage device implemented using semiconductor memories may include a plurality of memory devices and a memory controller configured to control the memory device to store and retrieve data in and from the memory device. Memory devices are classified into volatile memory devices such as a dynamic random access memory (DRAM) and static RAM (SRAM) and nonvolatile memory devices such as a read only memory (ROM), mask ROM (MROM), programmable ROM (PROM), erasable programmable ROM (EPROM), electrically erasable programmable ROM (EEPROM), ferromagnetic RAM (FRAM), phase-change RAM (PRAM), magnetic RAM (MRAM), resistive RAM (RRAM) and flash memory.

SUMMARY

Various embodiments are related to a controller capable of reading data stored in a memory cell more accurately, and an operating method thereof.

In accordance with an embodiment of the disclosed technology, a controller may include: a processor configured to read data from a memory device in communication with the controller; and a decoder in communication with the processor and configured to receive the read data from the processor and decode the read data, the read data being represented with check nodes and variable nodes, and wherein the decoder includes: a check unit configured to calculate syndrome values for the check nodes based on decision values of the variable nodes and a parity check matrix; a calculation unit in communication with the check unit and configured to receive the decision values of the variable nodes from the check unit and calculate flipping function values for each of the variable nodes based on the decision values of the variable nodes; a setting unit in communication with the calculation unit and configured to receive the flipping function values from the calculation unit and generate a candidate vector by dividing the flipping function values into groups and selecting at least some maximum values from the groups, the setting unit further configured to set a flipping function threshold value based on the candidate vector; and a flipping unit in communication with the setting unit and configured to receive the flipping function threshold value from the setting unit, compare the flipping function values of the variable nodes with the flipping function threshold value, and flip a decision value of a target variable node having a greater flipping function value than the flipping function threshold value.

In accordance with an embodiment of the disclosed technology, an operating method of a controller may include: obtaining read data by reading data from a memory device in communication with the controller, the read data provided to a decoder that uses check nodes and variable nodes for decoding the read data; calculating syndrome values for the check nodes based on decision values of the variable nodes and a parity check matrix; calculating flipping function values for each of the variable nodes based on the decision values of the variable nodes; generating a candidate vector to include some of the flipping function values; setting a flipping function threshold value based on the candidate vector; and comparing the flipping function threshold value with the flipping function values of the variable nodes and flipping a decision value of a target variable node having a greater flipping function value than the flipping function threshold value.

DETAILED DESCRIPTION

Hereafter, various embodiments will be described in detail with reference to the accompanying drawings. Some implementations of the disclosed technology suggest providing a decoder configured to generate a candidate vector to include some of flipping function values and to decode the read data using a flipping function threshold value that depends on ranges of a maximum value and a minimum value of the candidate vector.

A volatile memory device loses data stored therein when the power is removed, while a nonvolatile memory device retains data stored therein even though the power is removed. In particular, flash memory has advantages in that it has high programming speed and low power consumption and can store large-volume data. Thus, flash memory is widely used as a storage medium in a computer system and others electronic devices.

In a nonvolatile memory, for example, a flash memory, the states of data which can be stored in memory cells may be decided based on the number of bits stored in each of the memory cells. A memory cell capable of storing 1-bit data therein is a single-level cell or single-level cell (SLC). A memory cell capable of storing 2-bit data therein is a multi-bit cell, a multi-level cell (MLC), or a multi-state cell. A memory cell capable of storing 3-bit data in a cell is a triple-level cell (TLC). The MCL and the TLC are favorable for high integration of a memory. However, the increase in the number of bits programmed into one memory cell reduces the reliability of storage and retrieval of information and increases read failure rates.

Figure 1:
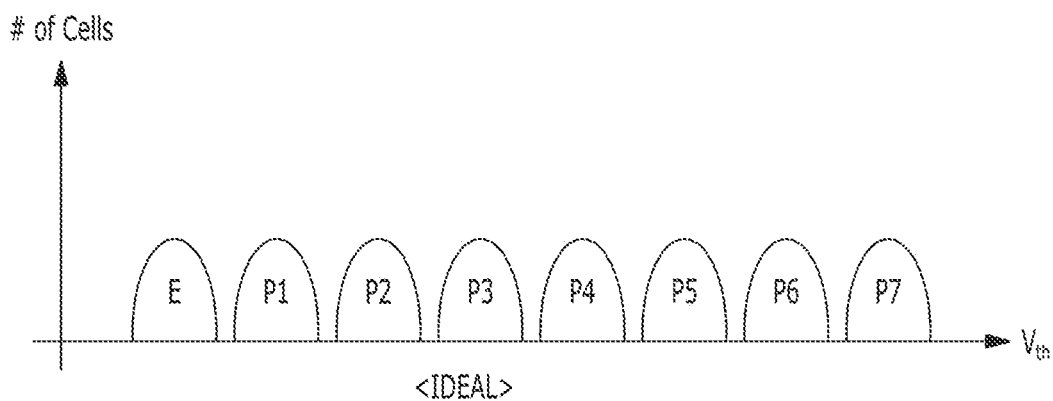
FIG. 1 is an example of a threshold voltage distribution graph illustrating program states and an erase state of a triple level cell (TLC) nonvolatile memory device.

For example, when k bits are to be programmed to one memory cell, any one of $2^K$ threshold voltages is formed in the memory cell. Due to differences in electrical characteristics of memory cells, a singular threshold voltage cannot be used for programming the same bit value for all memory cells; instead, the threshold voltages form a predetermined range of threshold voltage distribution to account for variability among different cells. Thus, the threshold voltage distributions correspond to $2^K$ data values which can be generated by the k bits. FIG. 1 shows a threshold voltage distribution graph illustrating program states and an erase state of a TLC (i.e., 3-bit) nonvolatile memory device. In FIG. 1 as an example, three bits (that is, k=3) are programmed to a single memory cell of the TLC nonvolatile memory device, for example, a TLC flash memory. In this case, in the memory cell, any one of eight threshold voltage distributions, which is obtained as $2^3$, is formed. In case of a TLC, seven program-state threshold voltage distributions P1 to P7 and one erase-state threshold voltage distribution E are formed. In an ideal situation as shown in FIG. 1, there is no overlap between adjacent threshold voltage distributions, and each of the threshold voltage distributions has a predetermined range of read voltage margin.

Figure 2:
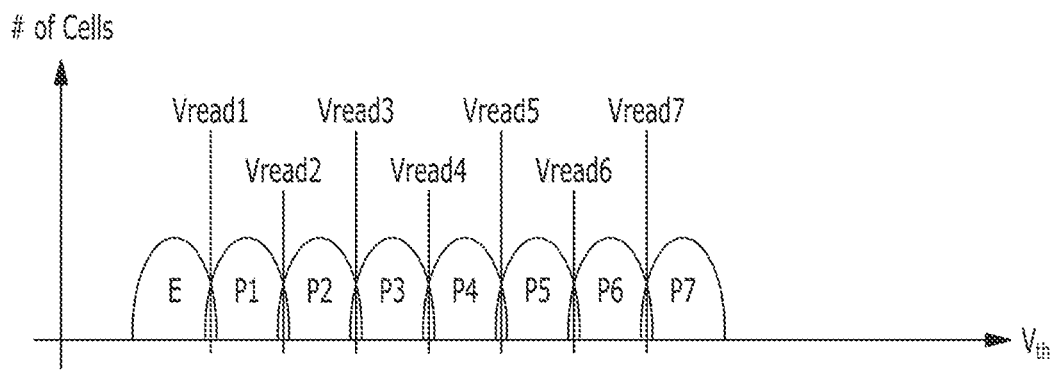
FIG. 2 is an example of a threshold voltage distribution graph illustrating program states and an erase state of a TLC nonvolatile memory device.

In actual situations, however, the voltage window in which the threshold voltage distributions can be arranged is limited. Therefore, as the value 'k' increases, the distance between the adjacent threshold voltage distributions is reduced and the adjacent threshold voltage distributions may overlap each other. As the adjacent threshold voltage distributions overlap, the number of error bits that are read in error (for example, several error bits or several tens of error bits) also increases. FIG. 2 is an example of a threshold voltage distribution graph illustrating program states and the erase state when there is an overlap between adjacent threshold voltage distributions. Similar to FIG. 1, it is assumed in FIG. 2 that three bits (that is, k=3) are programmed to a single memory cell of the TLC flash memory and any one of eight threshold voltage distributions is formed in the memory cell.

In case of a flash memory, the overlap of threshold, voltage distributions may be caused, due in-part to a charge loss, leading to overlapped distributions as illustrated in FIG. 2. Charge loss is manifested when electrons trapped in a floating gate or tunnel oxide are emitted and may reduce the threshold voltages. Furthermore, when the tunnel oxide deteriorates due to repeated program and erase operations, charge loss may further increase. As a result, the threshold voltage distributions may, for example, be shifted to the left.

Furthermore, program disturbance, erase disturbance and/ or back pattern dependency may broaden the threshold voltage distributions. Thus, the characteristics of the memory cells are degraded, which may result in the adjacent threshold voltage distributions of the respective states E and P1 to P7 to overlap each other as illustrated in FIG. 2.

The overlap of threshold voltage distributions in turn causes more read errors. For example, when a third read voltage Vread3 is applied when there is no overlap between the second and third program states P2 and P3, a memory cell is determined to have the second program state P2 in the case that the memory cell is in an on-state, or determined to have the third program state P3 in the case that the memory cell is in an off-state. However, when the third read voltage Vread3 is applied in the section where the second and third program states P2 and P3 overlap each other, the corresponding memory cell may be read as the on-state even though the memory cell is in the off-state.

In recognition of the above, there is a need for a technique capable of accurately reading data stored in a memory cell of the memory device. The disclosed technology can be implemented to provide a controller and an operating method of the controller, which can improve the reliability of data that is read from a memory device.

Figure 3A:
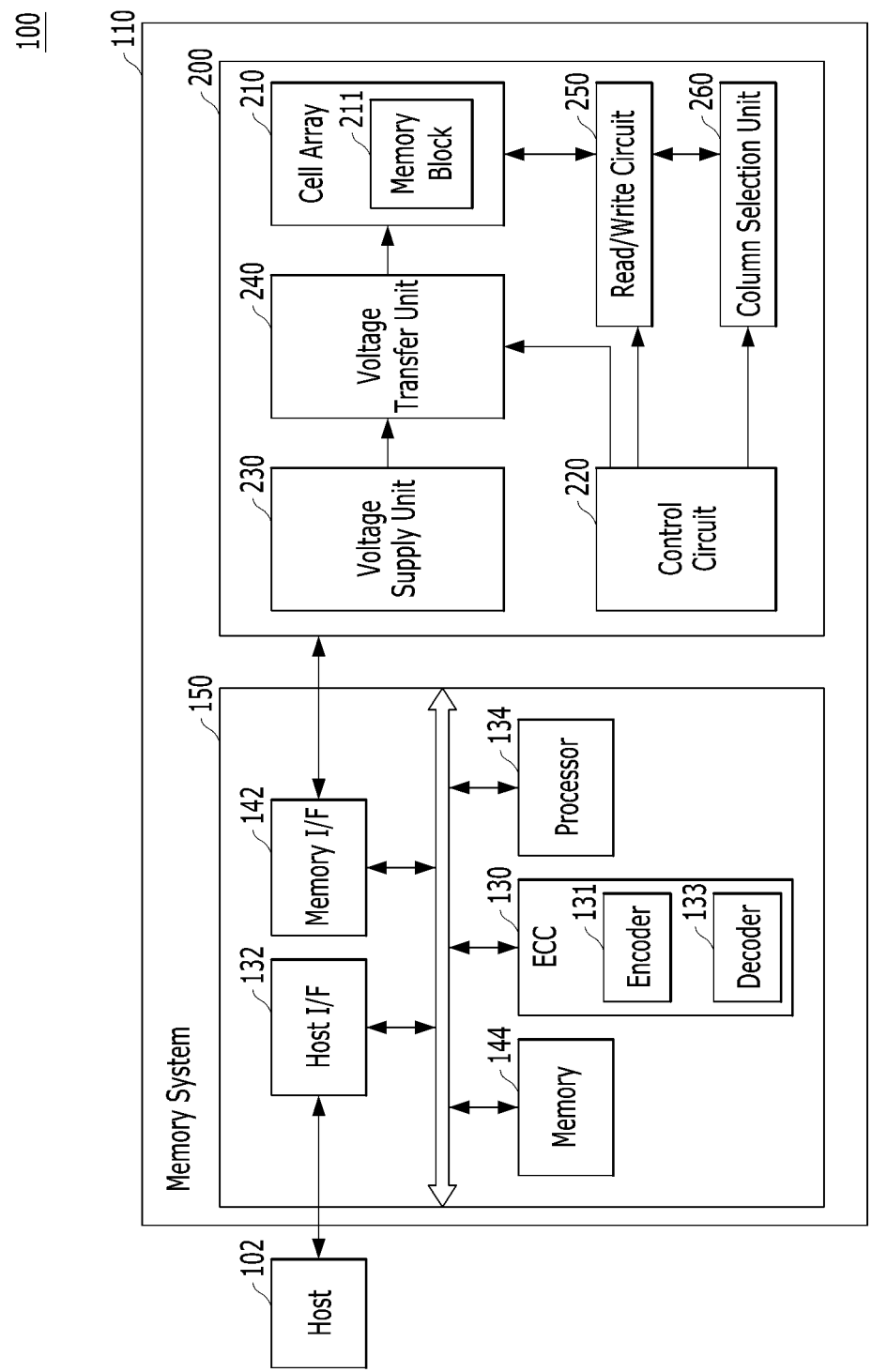
FIG. 3A is an example of a block diagram illustrating a memory system based on an embodiment of the disclosed technology.

FIG. 3A is an example of a block diagram illustrating a data processing system based on an embodiment of the disclosed technology.

The data processing system 100 may include a host 102 and a memory system 110. The host 102 may include any one of portable electronic devices such as a mobile phone, MP3 player and laptop computer or electronic devices such as a desktop computer, game machine, TV and projector. Thus, the host 102 may include wired/wireless electronic devices.

The host 102 may include at least one operating system (OS) or a plurality of OSs and execute an OS to perform an operation with the memory system 110 in response to a user request. The host 102 may transfer a plurality of commands corresponding to the user request to the memory system 110. Thus, the memory system 110 may perform operations corresponding to the commands, i.e. operations corresponding to the user request. The OS may manage and control overall functions and operations of the host 102, and provide an interaction between the host 102 and a user who uses the data processing system 100 or the memory system 110.

The memory system 110 may operate in response to a request of the host 102. In particular, the memory system 110 may store data accessed by the host 102. In other words, the memory system 110 may be used as a main memory device or secondary memory device of the host 102. The memory system 110 may be implemented as any one of various types of storage devices such as a solid state drive (SSD), a multi-media card (MMC) and an embedded MMC (eMMC), according to a host interface protocol coupled to the host 102.

The storage devices for implementing the memory system 110 may be configured as volatile memory devices such as a dynamic random access memory (DRAM) and static RAM (SRAM) and nonvolatile memory devices such as a read only memory (ROM), mask ROM (MROM), programmable ROM (PROM), erasable programmable ROM (EPROM), electrically erasable programmable ROM (EEPROM), ferromagnetic RAM (FRAM), phase-change RAM (PRAM), magnetic RAM (MRAM), resistive RAM (RRAM) and flash memory.

The memory system 110 may include a memory device 200 and a controller 150.

The memory device 200 may perform erase, write and read operations under control of the controller 150. The memory device 200 may receive a command CMD, an address ADDR and data DATA from the controller 150 through an input/output line. Furthermore, the memory device 200 may receive power PWR from the controller 150 through a power line, and receive a control signal CTRL from the controller 150 through a control line. The control signal CTRL may include a command latch enable signal CLE, an address latch enable signal ALE, a chip enable signal nCE, a write enable signal nWE, a read enable signal nRE, or others.

The controller 150 may control overall operations of the memory device 200. The controller 150 may include an ECC 130 for correcting error bits. The ECC 130 may include an encoder 131 and a decoder 133.

The encoder 131 may form data having a parity bit added thereto by performing error correction encoding on data to be programmed to the memory device 200. The parity bit may be stored in the memory device 200.

The decoder 133 may perform error correction decoding on data read from the memory device 200. The decoder 133 may determine whether the error correction decoding has succeeded, and output an indication signal based on the determination result. The decoder 133 may correct error bits of the data using the parity bit generated during the encoding process.

The ECC 130 may not correct the error bits when the number of the error bits is equal to or more than a correctable error bit threshold value. At this time, an error correction fail signal may be generated.

The ECC 130 may perform error correction using a low density parity check (LDPC) code. However, this is only an example, and the present embodiment is not limited thereto, and other techniques can be used to perform the error correction. In the descriptions below, as an example, the embodiment correcting error using the LDPC code will be described.

The ECC 130 may include a circuit, system or device for error correction. The LDPC code may include a binary LDPC code and a non-binary LDPC code. In some implementations, the ECC 130 may perform error-bit correction using hard decision data.

The controller 150 and the memory device 200 may be integrated into one semiconductor device. For example, the controller 150 and the memory device 200 may be integrated into one semiconductor device such as a solid state drive (SSD). The SSD may include a storage device configured to store data in a semiconductor memory. When the memory system 110 is used as the SSD, the operating speed of the host 102 coupled to the memory system 110 may be significantly improved.

Referring to FIG. 3A, the controller 150 may include a host interface (I/F) 132, a processor 134, a memory I/F 142, a memory 144 and the ECC 130.

The host I/F 132 may be configured to process a command and data of the host 102, and communicate with the host 102 through one or more various interface protocols such as USB (Universal Serial Bus), SATA (Serial Advanced Technology Attachment), SCSI (Small Computer System Interface) and ESDI (Enhanced Small Disk Interface). The host I/F 132 may be driven through firmware referred to as a host interface layer (HIL), and serve to exchange data with the host 102.

The memory interface (I/F) 142 may serve as a memory/storage I/F to interface the controller 150 and the memory device 200, such that the controller 150 controls the memory device 200 in response to a request of the host 102.

The memory 144 may serve as a working memory of the memory system 110 and the controller 150, and store data for driving the memory system 110 and the controller 150. The memory 144 may be implemented as a volatile memory. For example, the memory 144 may be implemented as a static random access memory (SRAM) or a dynamic random access memory (DRAM). Furthermore, the memory 144 may be present inside or outside the controller 150. In some implementations when the memory 144 may be present outside the controller 150, the memory 144 may be implemented as an external volatile memory to which, data from the controller 150 is inputted through the memory I/F.

The memory 144 may store data required for performing a data write/read operation which is performed between the host 102 and the memory device 200 and may further store data provided during the data write/read operation. For such a data storage operation, the memory 144 may include a program memory, a data memory, a write buffer/cache, a read buffer/cache, a data buffer/cache, a map buffer/cache, or others.

The processor 134 may control overall operations of the memory system 110. In some implementations, the processor 134 may control a program operation or read operation performed on the memory device 200 in response to a write request or read request from the host 102. The processor 134 may drive firmware referred to as a flash translation layer (FTL), in order to control overall operations of the memory system 110. The processor 134 may be implemented as a microprocessor or a central processing unit (CPU).

The controller 150 may perform an operation requested from the host 102 in the memory device 200 through the processor 134 implemented as a microprocessor or CPU. In some implementations, the controller 150 may perform a command operation corresponding to a command received from the host 102 with the memory device 200. In some implementations, the controller 150 may perform a background operation on the memory device 200. The background operation on the memory device 200 may include a garbage collection (GC) operation, a wear leveling (WL) operation, a map flush operation, a bad block management operation or others.

As such, the ECC 130 may detect and correct errors contained in the data read from the memory device 200. FIG. 3A illustrates that the ECC 130 includes the encoder 131 and the decoder 133. However, the encoder 131 and the decoder 133 may also be implemented as separate components.

In some implementations, the ECC 130 may perform LDPC encoding on original data to be programmed to the memory device 200 during a program operation. In this case, the ECC 130 may perform LDPC decoding on the encoded data programmed to the memory device 200, i.e. a codeword, during a read operation. By decoding the encoded data stored in the memory device 200, i.e. the codeword, the ECC 130 can recover the encoded data into the original data.

Figure 4:
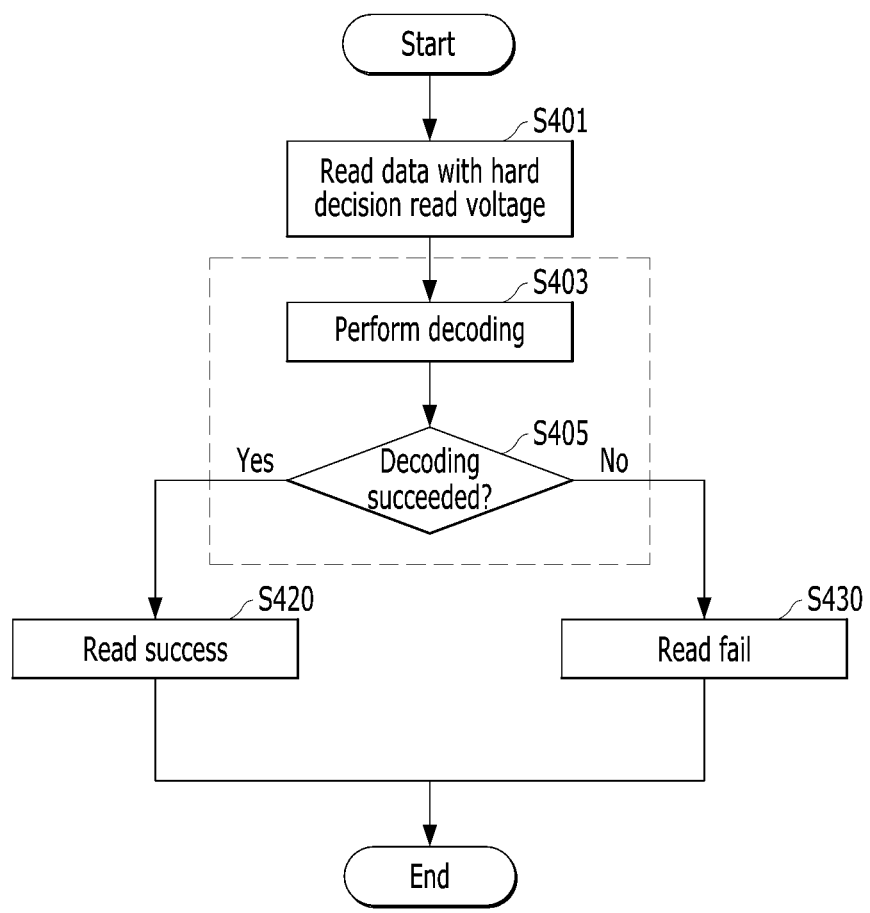
FIG. 4 is a flowchart illustrating an example of an operation of a controller based on an embodiment of the disclosed technology.

FIG. 4 shows a flowchart illustrating an operation of a controller included in a memory system 110. Referring to FIG. 4, a read operation for data, stored in the memory device 200 may include a hard decision read operation at step S401. The hard decision read operation may indicate an operation of reading data from the memory device 200 using a hard decision read voltage $V_{HD}$. Through the hard decision read operation, the encoded data read from the memory device 200, i.e. the codeword, may be decoded into the original data by the ECC 130. The operations in FIG. 4 will be further discussed later in this patent document.

Referring back to FIG. 3A, the memory device 200 may include a cell array 210, a control circuit 220, a voltage supply unit 230, a voltage transfer unit 240, a read/write circuit 250 and a column selection unit 260. The cell array 210 may include a plurality of memory blocks 211. The memory block 211 may store user data therein.

Figure 3B:
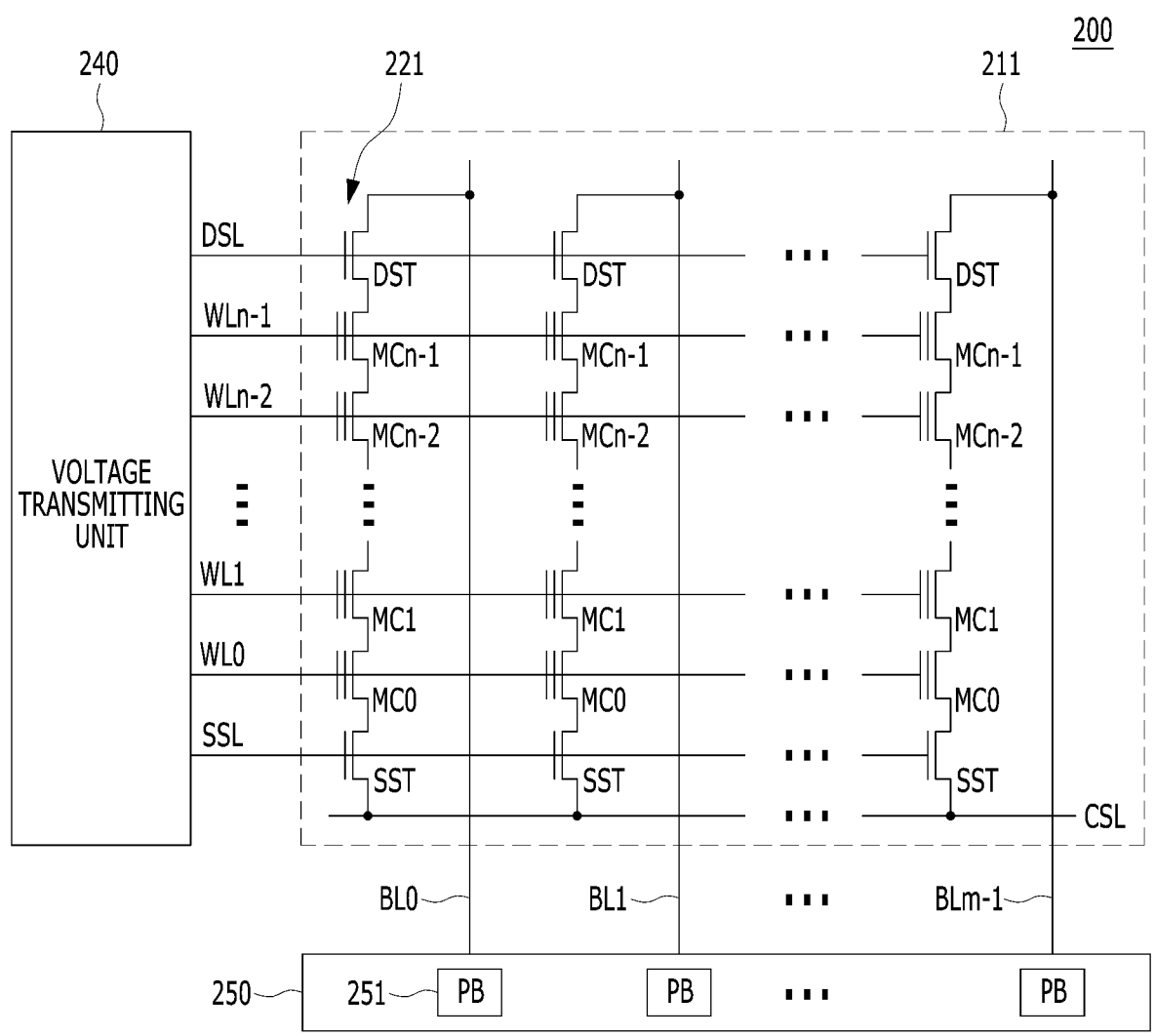
FIG. 3B is an example of a block diagram illustrating a memory block based on an embodiment of the disclosed technology.

FIG. 3B is an example of a block diagram illustrating a memory block in FIG. 3A. Referring to FIG. 3B, the memory block 211 may include a plurality of cell strings 221 coupled to bit lines BL0 to BLm−1, respectively. The cell string 221 of each column may include at least one drain select transistor DST and at least one source select transistor SST. Between the select transistors DST and SST, a plurality of memory cells or memory cell transistors MC0 to MCn−1 may be coupled in series. Each of the memory cells MC0 to MCn−1 may be configured as an MLC for storing multi-bit data information per cell. The strings 221 may be electrically coupled to the corresponding bit lines BL0 to BLm−1.

FIG. 3B illustrates the memory block 211 including NAND-type flash memory cells. However, the memory block 211 of the memory device is not limited to a NAND flash memory. In some implementations, the memory block 211 may be configured as a NOR-type flash memory, a hybrid flash memory having at least two or more types of memory cells mixed therein, or a one-NAND flash memory having a controller embedded in a memory chip. The operation characteristics of the semiconductor device may be applied to not only a flash memory device having a charge storage layer configured as a conductive floating gate, but also a charge trap flash (CTF) having a charge storage layer configured as a dielectric layer.

Referring back to FIG. 3A, the control circuit 220 may control overall operations related to the program, erase and read operations of the memory device 200.

The voltage supply unit 230 may provide word line voltages (for example, program voltage, read voltage and pass voltage) to be supplied to the respective word lines and a voltage to be supplied to a bulk (for example, well region) in which the memory cells are formed, depending on an operation mode. The voltage generation operation of the voltage supply unit 230 may be performed under control of the control circuit 220.

The voltage supply unit 230 may generate a plurality of variable read voltages to generate a plurality of read data.

The voltage transfer unit 240 may select one of the memory blocks (or sectors) of the memory cell array 210 and select one of the word lines of the selected memory block, in response to control of the control circuit 220. The voltage transfer unit 240 may provide the word line voltage generated from the voltage supply unit 230 to the selected word line and the unselected word lines, in response to control of the control circuit 220.

The read/write circuit 250 may be controlled by the control circuit 220, and operate as a sense amplifier or write driver depending on an operation mode. For example, in case of a verification/normal read operation, the read/write circuit 250 may operate as a sensing amplifier for reading data from the memory cell array 210. During the normal read operation, the column selection unit 260 may output data read from the read/write circuit 250 to the outside (for example, the controller 150) in response to column address information. On the other hand, the data read during the verification read operation may be provided to a pass/fail verification circuit (not illustrated) in the memory device 200, and used to determine whether memory cells have been successfully programmed.

In case of a program operation, the read/write circuit 250 may operate as a write driver to drive bit lines according to data to be stored in the cell array 210. During the program operation, the read/write circuit 230 may receive data to be written to the cell array 210 from a buffer (not illustrated), and drive bit lines according to the received data. For this operation, the read/write circuit 250 may be configured as a plurality of page buffers (PBs) 251 corresponding to columns (or bit lines) or column pairs (or bit line pairs), respectively. Each of the page buffers 251 may include a plurality of latches provided therein.

Referring to FIGS. 3A and 4, the controller 150 may perform a hard decision decoding operation. Target data of the hard decision decoding operation, i.e. data stored in the memory device 200, may be data encoded by the ECC 130 through, for example, LDPC encoding, i.e. a codeword.

For example, the controller 150 may perform hard decision LDPC decoding on a predetermined length of hard decision read data read from a memory cell of the memory block 211 through the hard decision read voltage $V_{HD}$. The hard decision decoding operation may include steps S401 to S405 as shown in FIG. 4.

In step S401, hard decision read data may be read from the memory device 200 with hard decision read voltages $V_{HD}$. The controller 150 may transfer, to the memory device 200, a read command and address to be read. The memory device 200 may read the hard decision read data from the memory device 200 with the hard decision read voltages $V_{HD}$, in response to receiving the read command and the address. The read hard decision read data may be transferred to the controller 150.

In step S403, a decoding, for example, hard decision LDPC decoding, may be performed. The ECC 130 may perform the hard decision LDPC decoding on the hard decision read data read from the memory device 200 with the hard decision read voltages $V_{HD}$, using an error correction code.

In step S405, the controller 150 may determine whether the decoding, for example, the hard decision LDPC decoding, has been successfully performed. In step S405, the controller 150 may determine whether an error of the hard decision data which has been decoded in step S403 using the hard decision LDPC decoding was corrected. For example, the controller 150 may determine whether the error of the decoded hard decision data was corrected using a parity check matrix. For example, when an operation result of the decoded hard decision data and the parity check matrix is a zero matrix ('0'), the controller 150 may determine that the decoded hard decision data is correct. When the operation result of the decoded hard decision data and the parity check matrix is not a zero matrix ('0'), the controller 150 may determine that the decoded hard decision data is not correct.

When the determination result of step S405 indicates that the hard decision LDPC decoding of step S403 has been successfully performed, the controller 150 determines in step S420 that the hard decision read operation is successful. Thus, the error correction decoding may be ended. In some implementations, the decoded hard decision data which is obtained in step S403 may be outputted as error-corrected data to the outside of the controller 150 or used in the controller 150.

When the determination result of step S405 indicates that the hard decision LDPC decoding of step S403 has been not successfully performed (i.e., failed), the controller 150 determines in step S430 that the hard decision read operation is failed. Thus, the error correction decoding may be ended.

Hereafter, the operation of the decoder 133 on hard decision data will be further described in detail with regard to steps S403 and S405 illustrated in FIG. 4.

When the ECC is used in a storage device, various physical phenomena which occur in the storage device may cause a noise effect that damages information stored in the storage device. An error correction coding scheme may be used to protect the stored information and avoid a final error. The error correction coding scheme may be performed by encoding information before the information is stored in a memory device. The encoding process may add redundancy to the information, and thus convert the bit sequence of the information into a codeword. Such redundancy may be used to recover information from a damaged codeword through a decoding process.

An iterative coding scheme configure a code as a sequence of several simple constituent codes. The code can be decoded by an iterative decoding algorithm while information is exchanged between constituent decoders of the simple codes. Typically, such a code may be defined by using a Tanner graph or bipartite graph indicating interconnection between constituent codes. In this case, decoding may be seen as repeated messages which are passed through graph edges.

Typical types of repeated codes may include an LDPC code. The LDPC code is a linear binary block code formed by a sparse parity check matrix H.

Figure 5A:
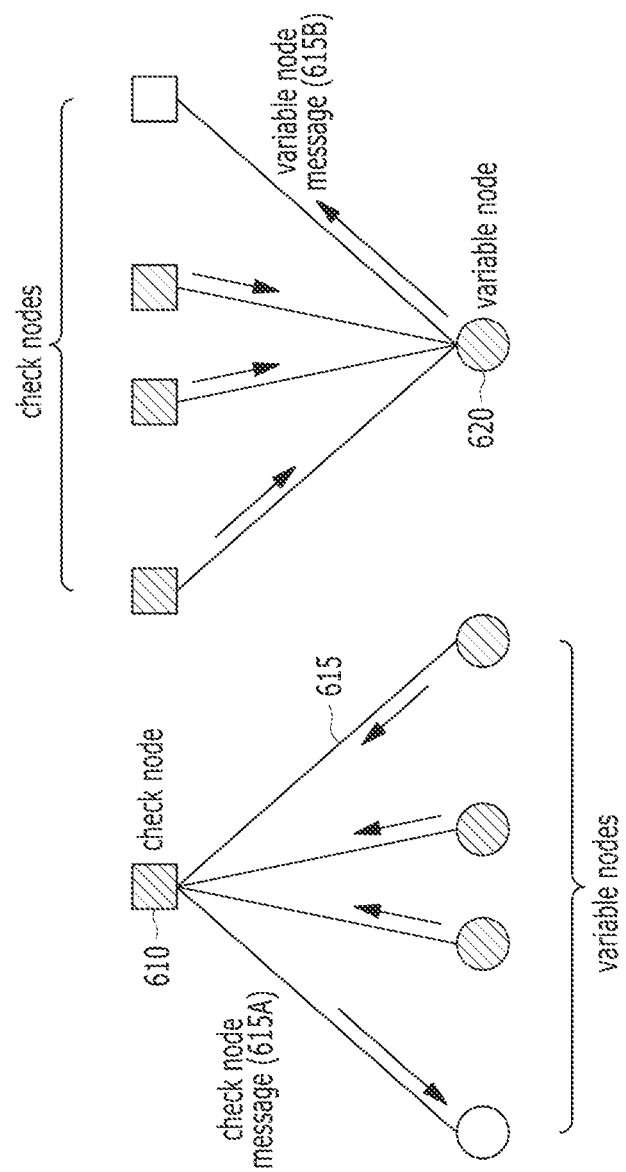
FIG. 5A is an example of a view illustrating LDPC decoding which is represented as a Tanner graph.

FIG. 5A shows an example diagram illustrating a LDPC decoding which is represented as a Tanner graph. The LDPC code includes a small number of 1's in each of rows and columns of a parity check matrix defining the code. Referring to FIG. 5A, the LDPC code may have a structure defined by a Tanner graph which includes check nodes 610, variable nodes 620, and edges 615 connecting the check nodes 610 and the variable nodes 620. A value transferred to the variable node 620 from the check node 610 after check node processing forms a check node message 630A, and a value transferred to the check node 610 from the variable node 620 after variable node processing forms a variable node message 630B.

The LDPC code may be generally decoded through iterative decoding by, for example, a sum-product algorithm. In addition, the LDPC code may also be decoded by a message-passing algorithm which is a suboptimal method such as a min-sum algorithm obtained by simplifying the sub-product algorithm.

Figures 5B, 5C:
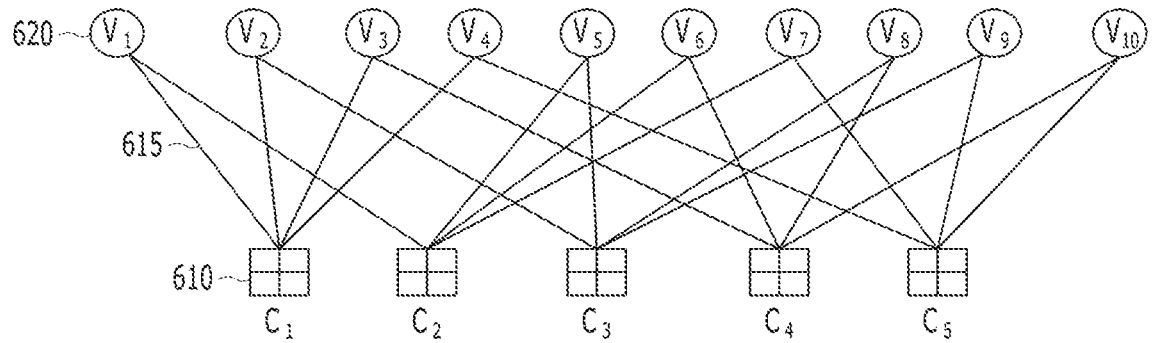
FIG. 5B is an example of a view illustrating an LDPC code structure.
FIG. 5C is an example of a view illustrating a syndrome check process based on LDPC decoding.

FIG. 5B shows an example diagram illustrating an LDPC code structure. For example, referring to FIG. 5B, the Tanner graph of the LDPC code may include five check nodes 610 indicating a predefined parity check equation of the LDPC code, ten variable nodes 620 indicating symbols, and edges 615 indicating correlations between the check nodes and the variable nodes. Each of the check nodes 610, the edges 615 may be connected to the variable nodes 620 corresponding to code symbols included in the parity check equation indicated by the check node 610. FIG. 5B illustrates a regular LDPC code in which a constant number of variable nodes, e.g., four variable nodes, are connected to each of the check nodes 610 and a constant number of check nodes, e.g., two check nodes, are connected to each of the variable nodes 620. The initial value of the variable node 620 may be hard decision data.

FIG. 5C illustrates an example syndrome check process based on an example LDPC decoding. FIG. 5C illustrates a parity check matrix H corresponding to the Tanner graph. The parity check matrix H is similar to a graphic expression of parity check equations, each column of the parity check matrix H has an equal number of 1's, and each row of the parity check matrix H has an equal number of 1's. Thus, each column of the parity check matrix H has two 1's indicating the connections of the check nodes 610 to the respective variable nodes 620, and each row of the parity check matrix H has four 1's indicating the connections of the variable nodes 620 to the respective check nodes 610.

During the LDPC decoding, the variable nodes 620 and the check nodes 610 on the Tanner graph may repeat a process of exchanging elements with each other, the elements being generated and updated in the respective nodes. In some implementations, each of the nodes may update the elements using the sum-product algorithm or a suboptimal method similar to the sum-product algorithm.

The LDPC decoding on a predetermined length of hard decision read data read from memory cells of the memory block 211 with the hard decision read voltage $V_{HD}$ may include a plurality of iterations, each including check node update, variable node update and syndrome check after initial update for the variable nodes 620. When the result of the syndrome check satisfies a predetermined condition after one iteration, the LDPC decoding may be ended. On the other hand, when the result of the syndrome check does not satisfy the predetermined condition, one iteration including the check node update, the variable node update and the syndrome check may be additionally performed. The number of iterations may be limited to a maximum number of iterations. If the result of the syndrome check does not satisfy the predetermined condition after the number of iterations reaches the maximum number of iterations, it may be declared that the LDPC decoding on the codeword has failed.

Referring to FIG. 5C, the syndrome check may indicate a process of checking whether the result of the product $Hv^t$ of the parity check matrix H and a vector v acquired as the result of the variable node update satisfies the predetermined condition. When a zero vector '0' is acquired as the result of the product, it may indicate that the result of the product satisfies the predetermined condition.

FIG. 5C illustrates an example of the syndrome check process in which a vector "01000" (which is not a zero vector) is obtained. Therefore, the syndrome check of FIG. 5C does not satisfy the predetermined condition, which shows that another iteration needs to be performed.

In the illustrated example, the vector is "01000," and the number of non-zero vector elements, i.e. the number of elements which do not satisfy the zero vector(0) condition of the syndrome check, is 1. The number of non-zero vector elements in an iteration may be referred to as an unsatisfied syndrome check (USC). The greater the number of USCs, the greater the number of error bits contained in hard decision read data.

Figure 6:
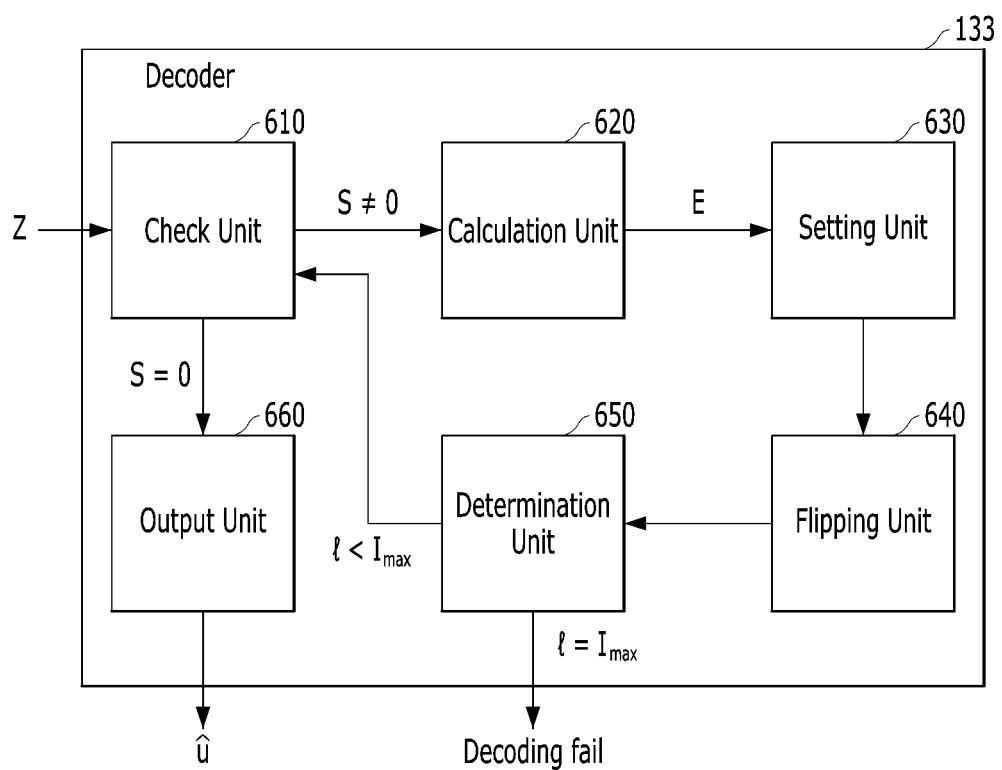
FIG. 6 illustrates an example structure of a decoder based on an embodiment of the disclosed technology.

FIG. 6 illustrates an example structure of a decoder based on an embodiment of the disclosed technology. FIG. 6 illustrates only components required for describing the present embodiment among components of the decoder 133. Thus, the decoder 133 may include other components than the elements shown in FIG. 6.

The decoder 133 may include a check unit 610, a calculation unit 620, a setting unit 630, a flipping unit 640, a determination unit 650 and an output unit 660.

The check unit 610 may calculate a syndrome value $s_m$ by utilizing the product of a decision value û of a variable node and the parity check matrix H. The initial value of the variable node is a hard decision value z obtained by reading data with a hard decision read voltage, and the decoder 133 may receive the hard decision value z. In some implementations, the check unit 610 may calculate syndrome values $s_m$ for all of the check nodes through Equation 1.

$$s_m = \sum_{n \in N(m)} \hat{u}_n H_{mn} (\text{mod} 2) \qquad \text{[Equation 1]}$$

In Equation 1, $s_m$, represents the syndrome value of an $m^{th}$ check node. Furthermore, $H_{mn}$ represents the element of an $m^{th}$ row and an $n^{th}$ column, which is not 0 but 1, in the parity check matrix of the LDPC code. In addition, N(m) represents the group of variable nodes connected to the $m^{th}$ check node, and is defined as Equation 2 below.

$$N(m) = \{n | H_{mn} \neq 0, 0 \leq n \leq N\}, 0 \leq m \leq M \qquad \text{[Equation 2]}$$

If all of the syndrome values are '0', the decoding may be stopped, and the check unit 610 may provide the decision value $\hat{u}_n$ of the variable node to the output unit 660. However, when the syndrome vector is not '0', the check unit 610 may provide the decision value $\hat{u}_n$ of the variable node to the calculation unit 620.

The calculation unit 620 may calculate flipping functions $E_n$ for all of the variable nodes based on the provided decision value $\hat{u}_n$ of the variable node, as expressed by Equation 3.

$$E_n = \sum_{m \in M(n)} s_m \qquad \text{[Equation 3]}$$

In Equation 3, M(n) represents the group of check nodes connected to the $n^{th}$ variable node, and is defined as Equation 4 below.

$$M(n) = \{m | H_{mn} \neq 0, 0 \leq m \leq M\}, 0 \leq n \leq N \qquad \text{[Equation 4]}$$

The calculation unit 620 may provide the calculated flipping function vectors $E = (E_1, E_2, \ldots E_N)$ to the setting unit 630.

The setting unit 630 may divide the provided flipping functions into a plurality of groups. For example, the setting unit 630 may divide the plurality of flipping functions into g groups. The plurality of flipping functions divided into g groups may be expressed as Equation 5 below.

$$E = \left(E_1, E_2, \ldots E_{\frac{N}{g}}, E_{\frac{N}{g}+1}, E_{\frac{N}{g}+2}, \right. \qquad \text{[Equation 5]}$$

$$\left. \ldots E_{\frac{2N}{g}}, \ldots E_{\frac{(g-1)N}{g}+1}, E_{\frac{(g-1)N}{g}+2}, \ldots E_N \right)$$

The setting unit 630 may select the greatest value in each of g groups as local maximum values included in the respective groups. Furthermore, the setting unit 630 may generate a vector $\Phi_x$ of values obtained by selecting x greatest values among the selected local maximum values in descending order. Hereafter, the vector will be referred to as a candidate vector. For example, when x is equal to 4, the setting unit 630 may select four greatest values among the local maximum values including the greatest values from the respective groups, and generate a candidate vector $\Phi_4$. The candidate vector $\Phi_x$ may be expressed as Equation 6 below.

$$\Phi_x = (E_{max,1}, E_{max,2}, \ldots, E_{max,x}) \qquad \text{Equation 6}$$

The setting unit 630 may set a threshold value using a candidate vector value, an iterative decoding number $\ell$, and a function h.

In some implementations, an error situation may be divided into four cases, depending on the range between the greatest value and the smallest value within the candidate vector $\Phi_x$ including x number of values. In the following descriptions, '$d_v$' represents the number of '1's which are present in a column of the parity check matrix. Furthermore, '$d_v$' may indicate the maximum value that the flipping function value of an arbitrary bit can have. When the flipping function value is greater than $$\left\lceil \frac{d_v}{2} \right\rceil,$$

it is highly likely that the bit corresponding to the flipping function value is an error. On the other hand, when the flipping function value is smaller than or equal to $$\left\lceil \frac{d_v}{2} \right\rceil,$$

it is highly likely that the bit corresponding to the flipping function value is not an error. Therefore, the setting unit 630 may set a flipping function threshold value θ based on '$d_v$'.

Since the maximum value of the candidate vector $\Phi_x$ is equal to the maximum value of the entire flipping function values, the maximum value of the candidate vector $\Phi_x$ may be the upper limit of the flipping function threshold value.

The minimum value of the candidate vector $\Phi_x$ may be the upper limit of the 'g−x' number of local maximum values other than the values of the candidate vector $\Phi_x$. The smaller the minimum value of the local maximum values is, the less the current number of error bits remains.

Based on the above, the setting unit 630 may set the threshold value as follows:

(1) First example when the maximum value of the candidate vector $\Phi_x$ is smaller than or equal to $$\left\lceil \frac{d_v}{2} \right\rceil + 1:$$

The setting unit 630 may set the maximum value of the candidate vector $\Phi_x$ to the flipping function threshold value $\theta$. When the maximum value of the candidate vector $\Phi_x$ is smaller than or equal to $$'\left[\frac{d_v}{2}\right]+1',$$

it is less likely that the bit corresponding to the flipping function value is an error. Therefore, the setting unit 630 may set the maximum value of the candidate vector $\Phi_x$ to the flipping function threshold value in order to flip an error bit having the lowest reliability.

(2) Second example when the maximum value of the candidate vector $\Phi_x$ is greater than $$'\left[\frac{d_v}{2}\right]+1'$$

and the minimum value of the candidate vector $\Phi_x$ is smaller than or equal to $$'\left[\frac{d_v}{2}\right]':$$

In this case, error bits remain only in the flipping function groups corresponding to all of the values of the candidate vector $\Phi_x$, respectively. Therefore, the setting unit 630 may set the flipping function threshold value $\theta$ to the smallest value among values that may not degrade the error correction ability. Thus, when the minimum value of the candidate vector $\Phi_x$ is smaller than or equal to $$'\left[\frac{d_v}{2}\right]',$$

the setting unit 630 may set the smallest value among the candidate vector values that are greater than $$'\left[\frac{d_v}{2}\right]'$$

to the flipping function threshold value $\theta$.

(3) Third example when the maximum value of the candidate vector $\Phi_x$ is greater than $$'\left[\frac{d_v}{2}\right]+1'$$

and the minimum value of the candidate vector $\Phi_x$ is equal to $$'\left[\frac{d_v}{2}\right]+1':$$

A greater number of error bits remain than in the second example. At this time, the setting unit 630 may set the minimum value of the candidate vector $\Phi_x$ to the flipping function threshold value $\theta$.

(4) Fourth example when the current situation is not included in the first to third examples: For example, when both of the maximum value and the minimum value of the candidate vector $\Phi_x$ are greater than $$'\left[\frac{d_v}{2}\right]+1',$$

it is difficult to estimate the 'g-x' number of local maximum values, which makes it difficult to estimate the number of remaining error bits. At this time, the setting unit 630 may set the flipping function threshold value $\theta$ based on the values of the candidate vector $\Phi_x$, using a look-up table (LUT). The LUT may include information through which the flipping function threshold value $\theta$ can be differently set depending on the values of the candidate vector $\Phi_x$. For example, when the candidate vector is provided as (6,6,6,6), the setting unit 630 may set, by referring to the LUT, the flipping function threshold value $\theta$ to '6' at a first iteration, set the flipping function threshold value $\theta$ to '5' at second to fourth iterations, and set the flipping threshold value $\theta$ to '4' after a fifth iteration.

The setting unit 630 may provide the set flipping function threshold value $\theta$ to the flipping unit 640.

The flipping unit 640 may compare the values of the flipping function $E_n$ to the flipping function threshold value $\theta$. Then, the flipping unit 640 may generate a group B by selecting variable nodes having a greater flipping function value than the flipping function threshold value $\theta$. The group B may be expressed as Equation 7 below.

$$B=\{n|E_n \geq \theta\} \qquad \text{[Equation 7]}$$

The flipping unit 640 may flip the bit values of the variable nodes within the group B. The flipping unit 640 may provide the flipped bit values of the variable nodes to the determination unit 650.

The determination unit 650 may check whether the current iteration number $\ell$ has reached the maximum iteration number $I_{max}$. If the current iteration number $\ell$ has reached the maximum iteration number $I_{max}$, the determination unit 650 may determine that the decoding operation for the hard decision data has failed. On the other hand, when the current iteration number $\ell$ has not reached the maximum iteration number $I_{max}$, the determination unit 650 may increase the current iteration number $\ell$ by and provide the flipped bit values of the variable nodes to the check unit 610 to repeat the decoding operation.

The output unit 660 may output the decision value provided from the check unit 610 to the outside. The output decision value, i.e. output data, may be either provided to the host 102 or used in the controller 150.

Figure 7:
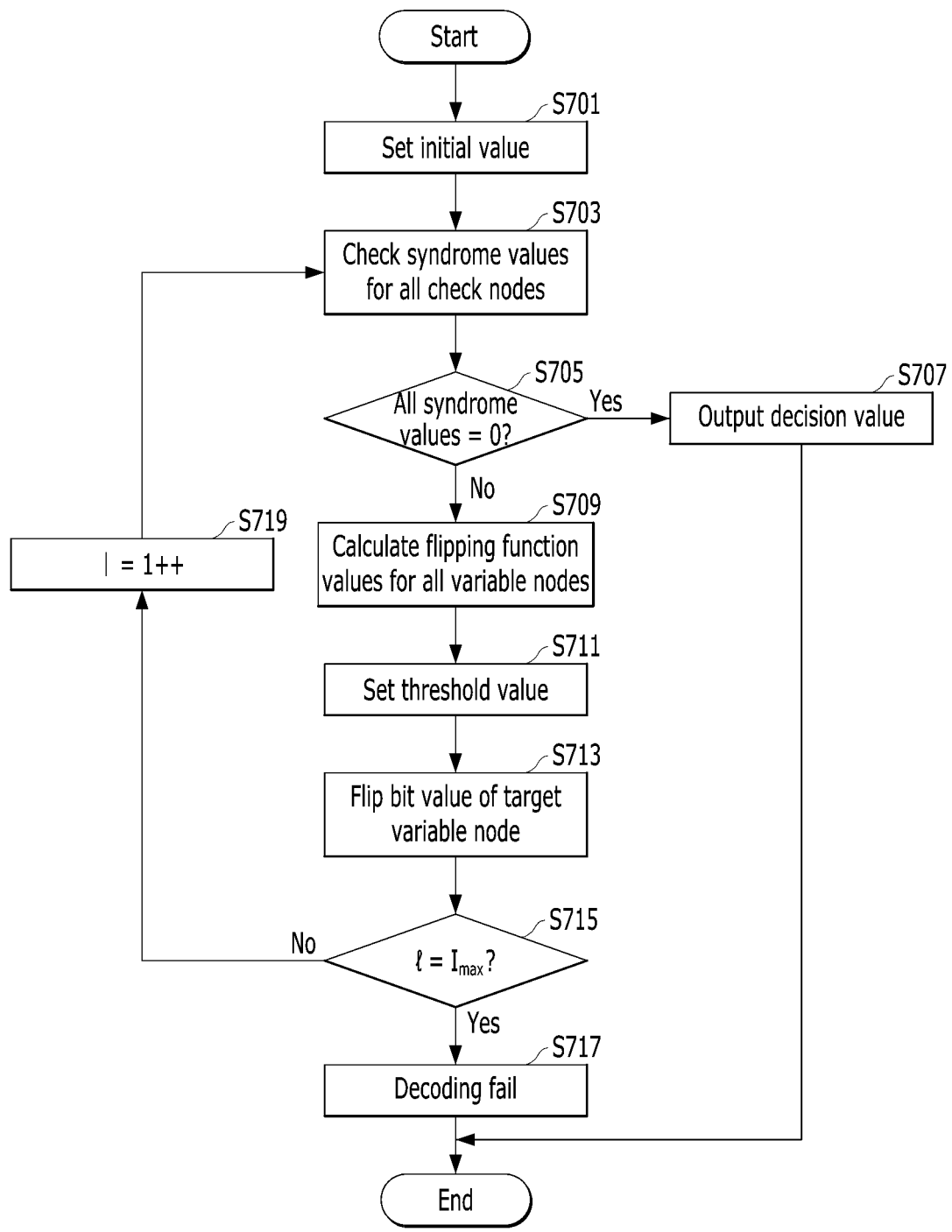
FIG. 7 illustrates an example of an operation process of a decoder based on an embodiment of the disclosed technology.

FIG. 7 is a flowchart illustrating an example of an operation process of a decoder based on one implementation of the disclosed technology.

In step S701, the decoder 133 may set an initial value. For example, the iteration number $\ell$ may be set to '0', the group B may be set to 'Ø', the decision values û of the variable nodes may be set to a hard decision value z provided from outside, and the flipping function value $E_n$ may be set to '0'.

In step S703, the check unit 610 may check syndrome values $s_m$ for all of the check nodes.

If all of the syndrome values $s_m$ are '0' ('Yes' in step S705), the check unit 610 may provide the decision value û to the output unit 660, and the output unit 660 may output the decision value û to the outside, in step S707.

When all of the syndrome values $s_m$ are not '0' (No' in step S705), the check unit 610 may provide the variable node decision value û to the calculation unit 620 and the calculation unit 620 may calculate the flipping function values $E_n$ for all of the variable nodes, in step S709.

In step S711, the calculation unit 620 may provide the calculated flipping function value $E_n$ to the setting unit 630, and the setting unit 630 may set the flipping function threshold value θ based on the flipping function value $E_n$. The operation process for setting the flipping function threshold value θ will be described in more detail with reference to FIG. 8.

In step S713, the setting unit 630 may provide the flipping function threshold value θ to the flipping unit 640, and the flipping unit 640 may generate a group B by selecting target variable nodes having a greater flipping function value than the flipping function threshold value θ. The flipping unit 640 may flip the bit values of the variable nodes within the group B. The flipping unit 640 may provide the flipped bit values of the variable nodes to the determination unit 650.

In step S715, the determination unit 650 may check whether the current iteration number $\ell$ has reached the maximum iteration number $I_{max}$.

If the current iteration number $\ell$ has, reached the maximum iteration number $I_{max}$ ('Yes' in step S715), the determination unit 650 may determine that the decoding operation for the hard decision data has failed.

On the other hand, when the current iteration number $\ell$ has not reached the maximum iteration number $I_{max}$ ('No' in step S715), the determination unit 650 may increase the current iteration number $\ell$ by '1', and provide the flipped bit values of the variable nodes to the check unit 610 to repeated perform the decoding operation of steps S703 to S715, in step S719.

Figure 8:
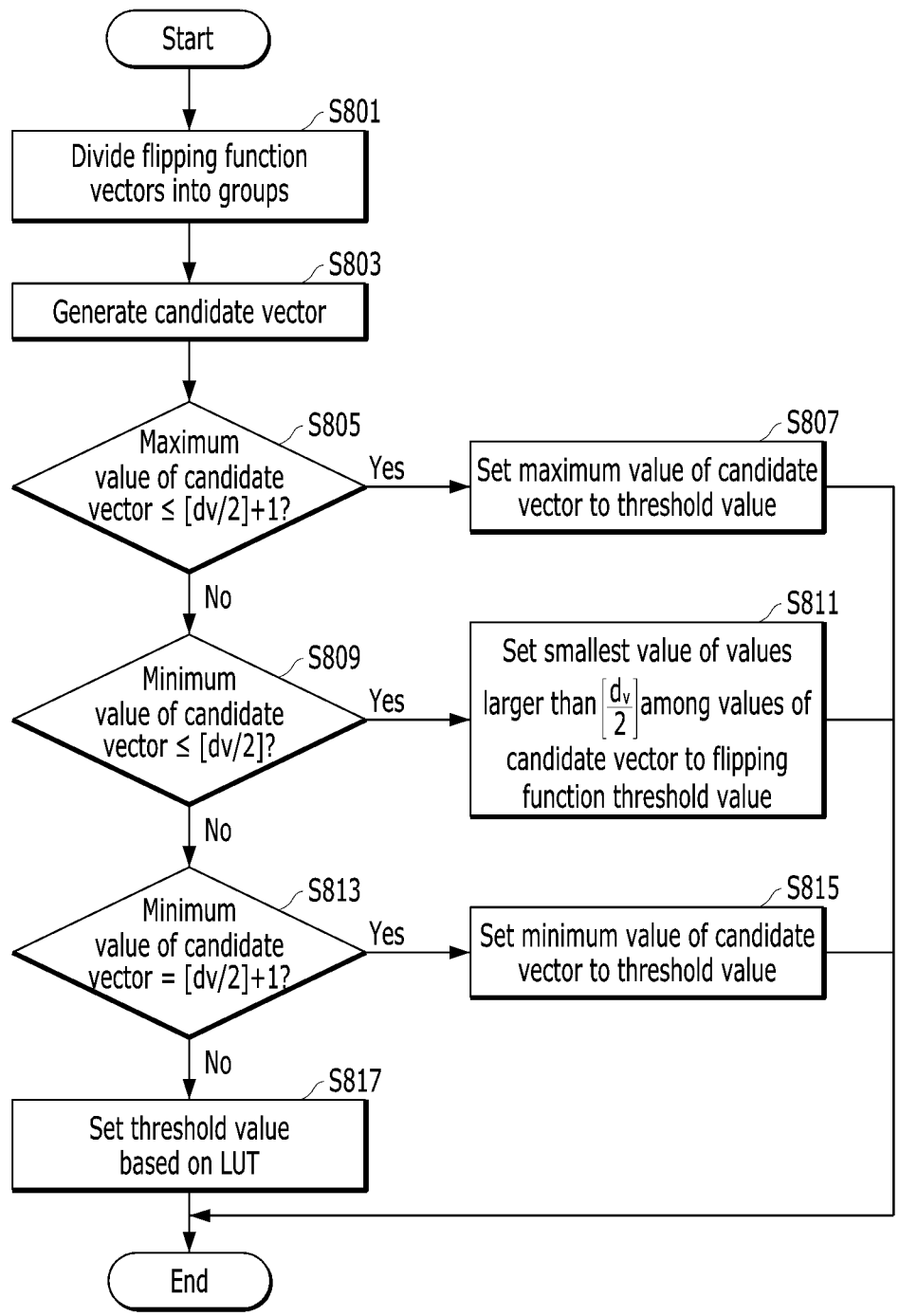
FIG. 8 illustrates an example of an operation process of the decoder based on an embodiment of the disclosed technology.

FIG. 8 is an example of a flowchart illustrating an operation process of a decoder based on one implementation of the disclosed technology. In particular, FIG. 8 illustrates an operation process of a setting unit of a decoder.

In step S801, the setting unit 630 may divide the flipping function vectors $E=(E_1, E_2, \ldots E_N)$ provided from the calculation unit 620 into a plurality of groups.

In step S803, the setting unit 630 may generate a candidate vector $\Phi_x$ by individually selecting local maximum values included in the divided groups, respectively, selecting x largest values among the selected local maximum values, and sorting the selected x values in descending order.

The setting unit 630 may set a flipping function threshold value θ as follows.

First, when the maximum value of the candidate vector $\Phi_x$ is smaller than or equal to $$'\left[\frac{d_v}{2}\right]+1'$$

('Yes' in step S805), the setting unit 630 may set the maximum value of the candidate vector $\Phi_x$ to the flipping function threshold value θ in step S807.

When the maximum value of the candidate vector $\Phi_x$ is greater than $$'\left[\frac{d_v}{2}\right]+1'$$

('No' in step S805) and, the minimum value of the candidate vector $\Phi_x$ is smaller than or equal to $$'\left[\frac{d_v}{2}\right]'$$

('Yes' in step S809), the setting unit 630 may set the smallest value of the candidate vector values which are greater than $$'\left[\frac{d_v}{2}\right]'$$

to the flipping function threshold value θ in step S811.

When the minimum value of the candidate vector $\Phi_x$ is greater than $$'\left[\frac{d_v}{2}\right]'$$

('No' in step S809) and equal to $$'\left[\frac{d_v}{2}\right]+1'$$

('Yes' in step S813), the setting unit 630 may set the minimum value of the candidate vector $\Phi_x$ to the flipping function threshold value θ in step S815.

When the minimum value of the candidate vector $\Phi_x$ is not equal to $$'\left[\frac{d_v}{2}\right]+1'$$

('No' in step S813), the setting unit 630 may set the flipping function threshold value θ based on the respective values of the candidate vectors $\Phi_x$, using the LUT, in step S817.

As described above, the disclosed technology provide a controller including a decoder which can adaptively find the flipping function threshold value by reflecting the current error situation based on a pattern of local maximum values. Therefore, the decoder can have a higher decoding speed than when the bit flipping operation is performed with the threshold value fixed to the maximum value of the flipping function values. Furthermore, since the decoder 133 is designed to guarantee a decoding success by reflecting the current error situation, the error correction ability of the decoder 133 may not be degraded even at a sufficient number of iterations. In addition, as the variable node degree is increased, the flipping function threshold value can be set in a wider range, which makes it possible to more effectively improve the decoding speed of the decoder 133.

Hereinafter, with reference to FIG. 9 to FIG. 14, memory systems including a decoder will be described.

Figure 9:
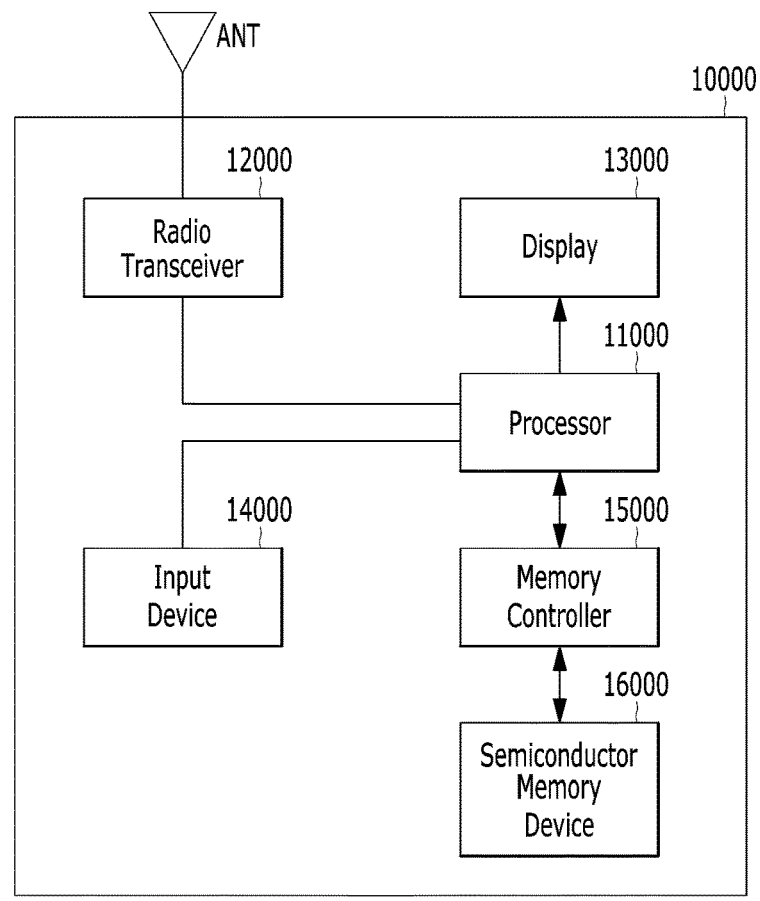
FIG. 9 is an example of a block diagram illustrating an electronic device including a memory system in accordance with an embodiment.

FIG. 9 is a block diagram schematically illustrating an electronic device including a controller and a memory device based on an embodiment of the disclosed technology.

Referring to FIG. 9, the electronic device 10000 such as a cellular phone, a smart phone, or a tablet PC may include the memory device 16000 implemented by a flash memory device and the controller 15000 to control the memory device 16000.

The memory device 16000 may correspond to the memory device 200 described above with reference to FIGS. 3A to 4. The memory device 16000 may store random data.

The controller 15000 may correspond to the controller 150 described, with reference to FIGS. 3A to 10. The controller 15000 may be controlled by a processor 11000 which controls overall operations of the electronic device 10000.

Data stored in the memory device 16000 may be displayed through a display 13000 under the control of the controller 15000. The controller 15000 operates under the control of the processor 11000.

A radio transceiver 12000 may receive and output a radio signal through an antenna ANT. For example, the radio transceiver 12000 may convert the received radio signal from the antenna ANT into a signal to be processed by the processor 11000. Thus, the processor 11000 may process the converted signal from the radio transceiver 12000, and may store the processed signal at the memory device 16000. Otherwise, the processor 11000 may display the processed signal through the display 13000.

The radio transceiver 12000 may convert a signal from the processor 11000 into a radio signal, and may output the converted radio signal to an external device through the antenna ANT.

An input device 14000 may receive a control signal for controlling operations of the processor 11000 or data to be processed by the processor 11000, and may be implemented by a pointing device such as a touch pad or a computer mouse, a key pad, or a keyboard.

The processor 11000 may control the display 13000 such that the data from the memory device 16000, the radio signal from the radio transceiver 12000 or the data from the input device 14000 is displayed through the display 13000.

Figure 10:
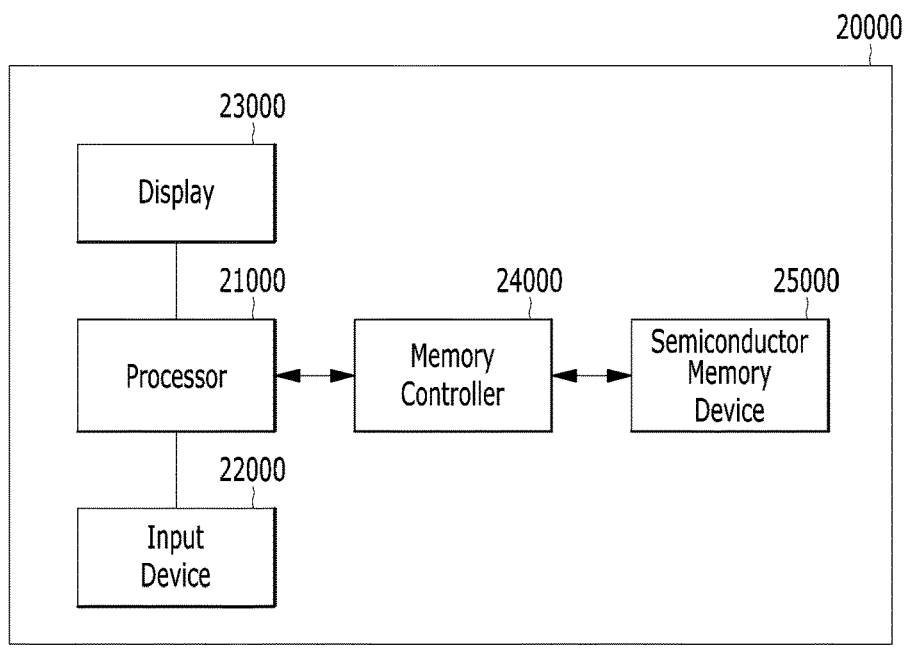
FIG. 10 is an example of a block diagram illustrating an electronic device including a memory system based on an embodiment of the disclosed technology.

FIG. 10 is a block diagram schematically illustrating an electronic device including a controller and a memory device based on an embodiment of the disclosed technology.

The controller 24000 and the memory device 25000 may correspond to the controller 150 and the memory device 200 described with reference to FIGS. 3A to 10, respectively.

Referring to FIG. 10, the electronic device 20000 may be implemented by a data processing device such as a personal computer (PC), a tablet computer, a net-book, an e-reader, a personal digital assistant (PDA), a portable multimedia player (PMP), an MP3 player, or an MP4 player, and may include the memory device 25000, e.g., the flash memory device, and the controller 24000 to control operations of the memory device 25000.

The electronic device 20000 may include a processor 21000 to control overall operations of the electronic device 20000. The controller 24000 may be controlled by the processor 21000.

The processor 21000 may display data stored in the memory device 25000 through a display 23000 according to an input signal from an input device 22000. For example, the input device 22000 may be implemented by a pointing device such as a touch pad or a computer mouse, a key pad, or a keyboard.

Figure 11:
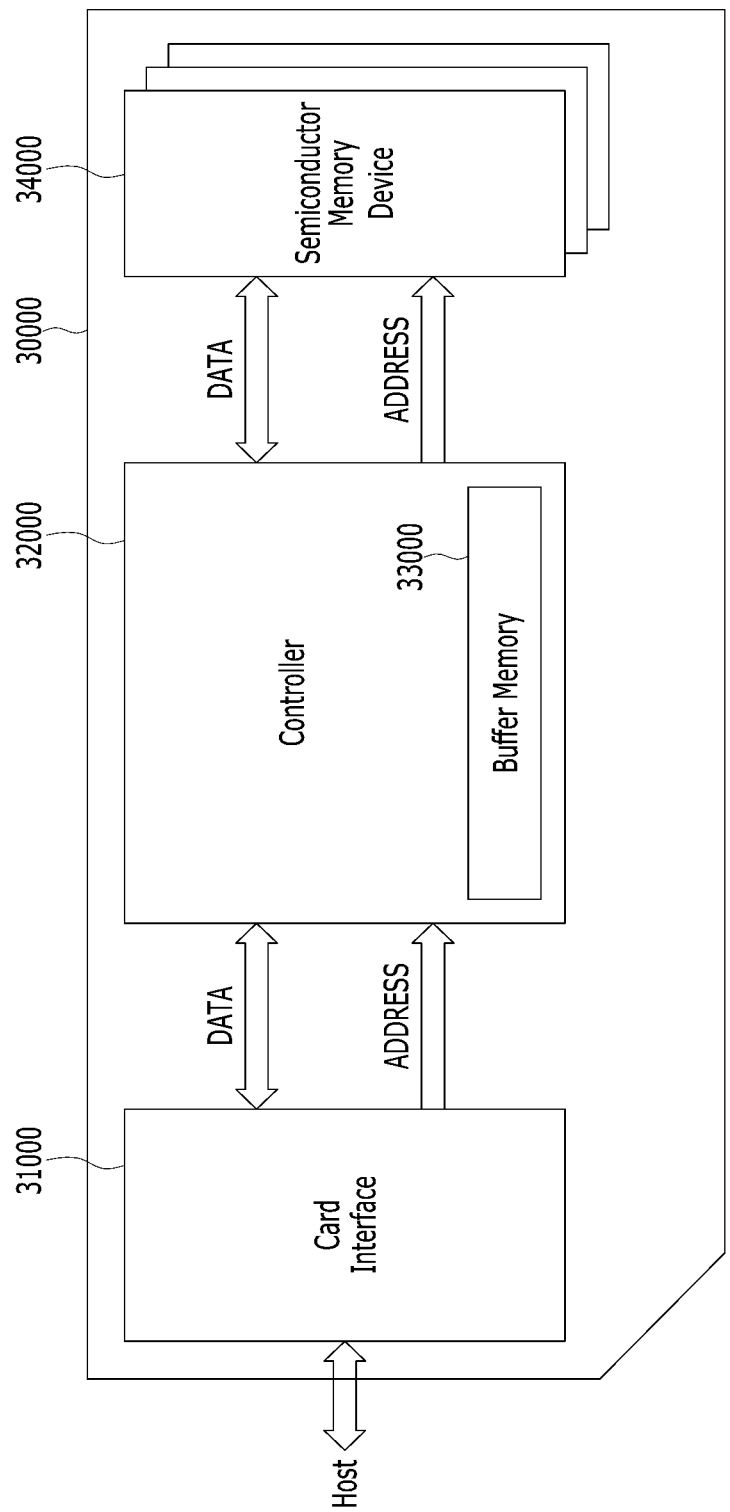
FIG. 11 is an example of a block diagram illustrating an electronic device including a memory system based on an embodiment of the disclosed technology.

FIG. 11 is a block diagram schematically illustrating an electronic device including a controller and a memory device based on an embodiment of the disclosed technology.

The controller 32000 and the memory device 34000 may correspond to the controller 150 and the memory device 200 described with reference to FIGS. 3A to 10, respectively.

Referring to FIG. 11, the electronic device 30000 may include a card interface 31000, the controller 32000, and the memory device 34000, for example, a flash memory device.

The electronic device 30000 may exchange data with a host through the card interface 31000. The card interface 31000 may be or include a secure digital (SD) card interface or a multi-media card (MMC) interface. Other implementations are also possible. The card interface 31000 may interface the host and the controller 32000 according to a communication protocol of the host capable of communicating with the electronic device 30000.

The controller 32000 may control an overall operation of the electronic device 30000, and may control data exchange between the card interface 31000 and the memory device 34000. A buffer memory 33000 of the controller 32000 may buffer data transferred between the card interface 31000 and the memory device 34000.

The controller 32000 may be coupled with the card interface 31000 and the memory device 34000 through a data bus DATA and an address bus. ADDRESS. In accordance with an embodiment, the controller 32000 may receive an address of data, which is to be read or written, from the card interface 31000, through the address bus ADDRESS, and may send it to the memory device 34000. Further, the controller 32000 may receive or transfer data to be read or written through the data bus DATA connected with the card interface 31000 or the memory device 34000.

When the electronic device 30000 is connected with the host such as a PC, a tablet PC, a digital camera, a digital audio player, a mobile phone, console video game hardware or a digital set-top box, the host may exchange data with the memory device 34000 through the card interface 31000 and the controller 32000.

Figure 12:
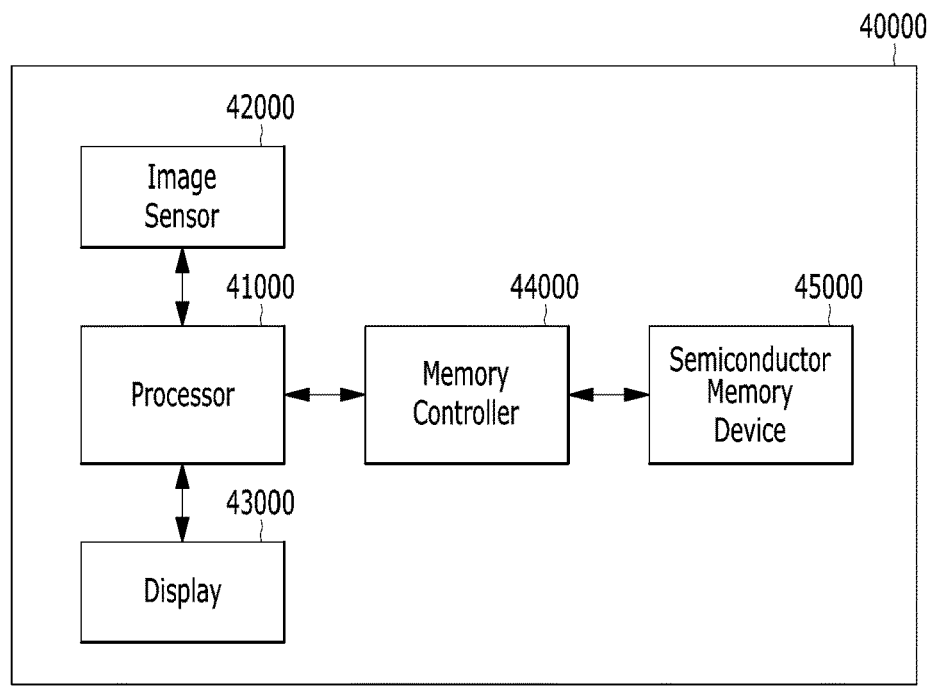
FIG. 12 is an example of a block diagram illustrating an electronic device including a memory system based on an embodiment of the disclosed technology.

FIG. 12 is a block diagram schematically illustrating an electronic device including a controller 44000 and a memory device based on an embodiment of the disclosed technology.

The controller 44000 and the memory device 45000 may correspond to the controller 150 and the memory device 200 described with reference to FIGS. 3A to 10, respectively.

Referring to FIG. 12, the electronic device 40000 may include the memory device 45000, e.g., the flash memory device, the controller 44000 to control a data processing operation of the memory device 45000, and a processor 41000 to control overall operations of the electronic device 40000.

Further, an image sensor 42000 of the electronic device 40000 may convert an optical, signal into a digital signal, and the converted digital signal may be stored in the memory device 45000 under the control of the processor 41000. Otherwise, the converted digital signal may be displayed through a display 43000 under the control of the processor 41000.

Figure 13:
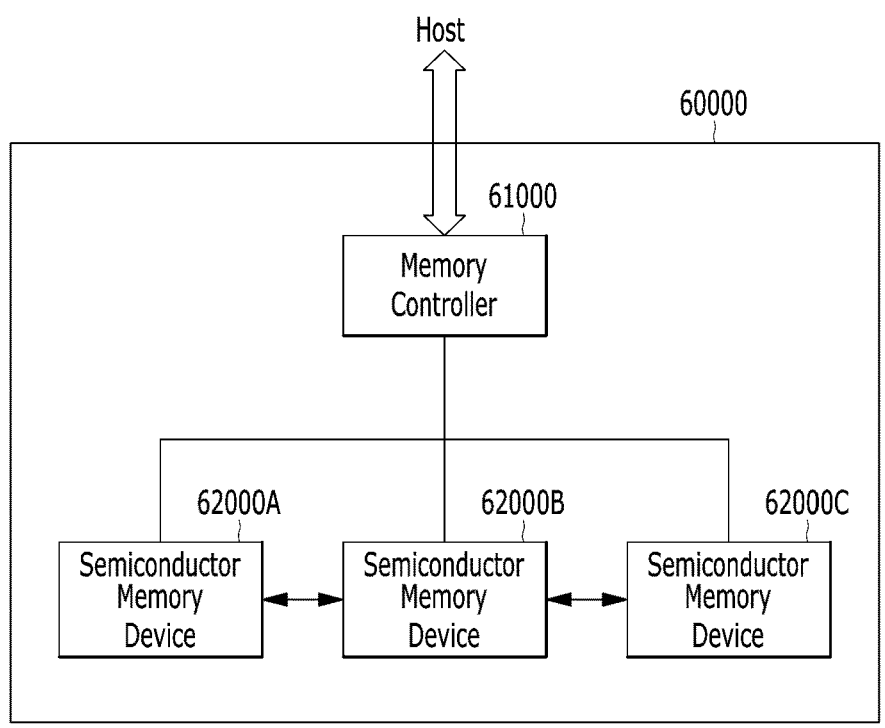
FIG. 13 is an example of a block diagram illustrating an electronic device including a memory system based on an embodiment of the disclosed technology.

FIG. 13 is a block diagram schematically illustrating an electronic device including a controller and memory devices based on an embodiment of the disclosed technology.

The controller 61000 and each of the memory devices 62000A, 62000B, and 62000C may correspond to the controller 150 and the memory device 200 described with reference to FIGS. 3A to 10, respectively.

Referring to FIG. 13, the electronic device 60000 may be implemented by a data storage device such as a solid state drive (SSD).

The electronic device 60000 may include the plurality of memory devices 62000A, 62000B, and 62000C and the controller 61000 to control a data processing operation of each of the memory devices 62000A, 62000B, and 62000C.

The electronic device 60000 may be implemented by a memory system or a memory module.

For example, the controller 61000 may be implemented outside or inside the electronic device 60000.

Figure 14:
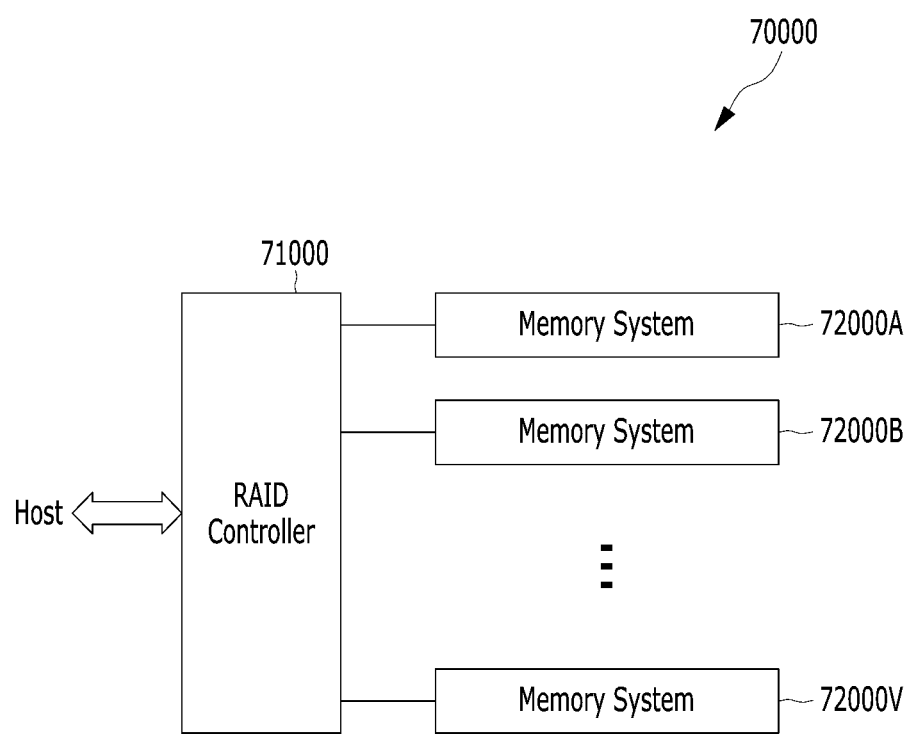
FIG. 14 is an example of a block diagram illustrating a data processing system including the electronic device of FIG. 13.

FIG. 14 is a block diagram off data processing system including an electronic device described with reference to FIG. 13.

Referring to FIGS. 13 and 14, a data storage device 70000 may be implemented by a redundant array of independent disks (RAID) system. The data storage device 70000 may include a RAID controller 71000 and a plurality of memory systems 72000A to 72000N, where N is a natural number.

Each of the memory systems 72000A to 72000N may correspond to the electronic, device 60000 described with reference to FIG. 13. The memory systems 72000A to 72000N may form a RAID array. The data storage device 70000 may be implemented by an SSD.

During a program operation, the RAID controller 71000 may output program data, which is output from a host, to one of the memory systems 72000A to 72000N according to one selected from a plurality of RAID levels based on RAID level information output from the host.

During a read operation, the RAID controller 71000 may transfer data, which is read from one of the memory systems 72000A to 72000N, to the host according to one of the RAID levels based on the RAID level information output from the host.

In accordance with the present, embodiments, it is possible to correctly read data stored in a memory cell of a memory device.

Although various embodiments have been described for illustrative purposes, it will be apparent to those skilled in the art that various changes and modifications may be made.

What is claimed is:

1. A controller comprising:
a processor configured to read data from a memory device in communication with the controller; and
a decoder in communication with the processor and configured to receive the read data from the processor and decode the read data, the read data being represented with check nodes and variable nodes, and
wherein the decoder comprises:
a check unit configured to calculate syndrome values for the check nodes based on decision values of the variable nodes and a parity check matrix;
a calculation unit in communication with the check unit and configured to receive the decision values of the variable nodes from the check unit and calculate flipping function values for each of the variable nodes based on the decision values of the variable nodes;
a setting unit in communication with the calculation unit and configured to receive the flipping function values from the calculation unit and generate a candidate vector by dividing the flipping function values into groups and selecting at least some maximum values from the groups, the setting unit further configured to set a flipping function threshold value based on the candidate vector; and
a flipping unit in communication with the setting unit and configured to receive the flipping function threshold value from the setting unit, compare the flipping function values of the variable nodes with the flipping function threshold value, and flip a decision value of a target variable node having a greater flipping function value than the flipping function threshold value.

2. The controller of claim 1, wherein the check unit is further configured to check whether all of the syndrome values are 0, and the calculation unit is operable to calculate the flipping function values when all of the syndrome values are not 0.

3. The controller of claim 2, wherein upon a determination that the maximum value of the candidate vector is smaller than or equal to $$\left[\frac{d_v}{2}\right]+1$$

where $d_v$ represents a possible maximum value of the flipping function values, the flipping function threshold value is set as the maximum value of the candidate vector.

4. The controller of claim 2, wherein the decoder further comprises an iteration determination unit in communication with the check unit and the flipping unit, the iteration determination unit configured to determine whether to repeat a decoding operation based on a threshold iteration number.

5. The controller of claim 4, wherein upon a determination that a current iteration number has not reach the threshold iteration number, the decoder is configured to repeat a decoding operation based on flipped decision values of the variable nodes.

6. The controller of claim 4, wherein upon a determination that a current iteration number has reached the threshold iteration number, the determination unit is configured to determine a failure of the decoding operation.

7. The controller of claim 2, wherein the decoder further comprises an output unit in communication with the check unit and configured to receive decision values of the variable nodes from the check unit and output the decision values of the variable nodes, upon a determination that all of the syndrome values are 0.

8. The controller of claim 1, wherein the setting unit is further configured to generate the candidate vector by sorting the selected values in a descending order.

9. The controller of claim 1, wherein upon a determination that the maximum value of the candidate vector is larger than $$\left[\frac{d_v}{2}\right]+1$$

and the minimum value of the candidate vector is smaller than or equal to $$\left[\frac{d_v}{2}\right]$$

where $d_v$ represents a possible maximum value of the flipping function values, the flipping function threshold value is set as the smallest value among values greater than $$\left[\frac{d_v}{2}\right]$$

and included in the candidate vector.

10. The controller of claim 1, wherein upon a determination that the maximum value of the candidate vector is greater than $$\left[\frac{d_v}{2}\right]+1$$

and the minimum value of the candidate vector is equal to $$\left[\frac{d_v}{2}\right]+1$$

where $d_v$ represents a possible maximum value of the flipping function values, the flipping function threshold value is set as the minimum value of the candidate vector.

11. The controller of claim 1, wherein upon a determination that both of the maximum value and the minimum value of the candidate vector are greater than $$\left[\frac{d_v}{2}\right]+1,$$

the flipping function threshold value is obtained based on a lookup table including information to differently set the flipping function threshold value depending on values of the candidate vector.

12. An operating method of a controller, comprising:
obtaining read data by reading data from a memory device in communication with the controller, the read data provided to a decoder that uses check nodes and variable nodes for decoding the read data;
calculating syndrome values for the check nodes based on decision values of the variable nodes and a parity check matrix;
calculating flipping function values for each of the variable nodes based on the decision values of the variable nodes;
generating a candidate vector to include some of the flipping function values;
setting a flipping function threshold value based on the candidate vector; and
comparing the flipping function threshold value with the flipping function values of the variable nodes and flipping a decision value of a target variable node having a greater flipping function value than the flipping function threshold value.

13. The operating method of claim 12, further comprising, prior to calculating the flipping function values, checking whether all of the syndrome values are 0 based on a product of the decision values of the variable nodes and the parity check matrix.

14. The operating method of claim 13, further comprising outputting the decision values of the variable nodes, upon a determination that all of the syndrome values are 0.

15. The operating method of claim 12, wherein generating the candidate vector comprises:
dividing the flipping function values into groups;
selecting a predetermined number of local maximum values that correspond to largest valued maxima among a plurality of local maximum values in the respective groups; and
sorting the selected values in a descending order.

16. The operating method of claim 12, wherein the setting of the flipping function threshold value comprises setting the flipping function threshold value as a maximum value of the candidate vector, upon a determination that the maximum value of the candidate vector is smaller than or equal to $$\left[\frac{d_v}{2}\right]+1$$

where $d_v$ represents a possible maximum value of the flipping function values.

17. The operating method of claim 12, wherein the setting of the flipping function threshold value comprises setting the flipping function threshold value as the smallest value of values greater than $$\left[\frac{d_v}{2}\right]$$

among values of the candidate vector, upon a determination that the maximum value of the candidate vector is greater than $$\left[\frac{d_v}{2}\right]+1$$

and the minimum value of the candidate vector is smaller than or equal to $$\left[\frac{d_v}{2}\right]$$

where $d_v$ represents a possible maximum value of the flipping function values.

18. The operating method of claim 12, wherein the setting of the flipping function threshold value comprises setting the flipping function threshold value as a minimum value of the candidate vector, upon a determination that the maximum value of the candidate vector is greater than $$\left[\frac{d_v}{2}\right]+1$$

and the minimum value of the candidate vector is equal to $$\left[\frac{d_v}{2}\right]+1$$

where $d_v$ represents a possible maximum value of the flipping function values.

19. The operating method of claim 12, wherein the setting of the flipping function threshold value comprises setting the flipping function threshold value based on a lookup table including information to differently set the flipping function threshold value depending on values of the candidate vector, upon a determination that both of a maximum value and a minimum value of the candidate vector are greater than $$\left[\frac{d_v}{2}\right]+1$$

where $d_v$ represents a possible maximum value of the flipping function values.

20. The operating method of claim 12, further comprising:
determining whether a current number of iterations has reached a threshold iteration number; and
repeating a decoding operation based on flipped decision values of the variable nodes, upon a determination that the current iteration number has not reached the threshold iteration number and determining a failure of the decoding operation upon a determination that the current iteration number has reached the threshold iteration number.

* * * * *